United States Patent Office 3,050,388

Patented Aug. 21, 1962

3,050,388

PRESENSITIZED PRINTING PLATES AND METHOD FOR THE PRODUCTION THEREOF

Wilhelm Neugebauer, Oskar Süs, and August Rebenstock, all of Wiesbaden-Biebrich, Germany, assignors, by mesne assignments, to Azoplate Corporation, Murray Hill, N.J., a corporation of New Jersey No Drawing. Filed July 28, 1958, Ser. No. 751,113
Claims priority, application Germany Aug. 3, 1957
45 Claims. (Cl. 96—33)

This invention relates to presensitized lithographic printing plates and, more particularly, to a presensitized printing plate comprising a base material having a light-sensitive layer thereon including a p-iminoquinone-diazide.

In practical planographic and offset printing operations, the o- and p-quinone-diazide sulfonic acids, especially those derived from N-aryl-sulfonated p-phenylene-diamines, are useful in the production of printing plates using a photomechanical process.

P-iminoquinone-diazides which are derived from N-aryl-sulfonyl-p-phenylene-diamines, and having the general formula

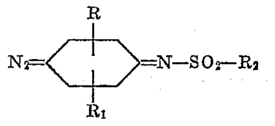

in which R and $R_1$ may be hydrogen, alkyl, alkoxy, or halide radicals, and $R_2$ is aryl or a substituted aryl radical, are transformed by exposure to light into decomposition products which, in contrast to the initial p-iminoquinone-diazides, are practically insoluble in dilute alkalies, dilute acids and organic solvents. When a metal foil or a paper sheet, coated with a light-sensitive layer containing an iminoquinone-diazide corresponding to the formula given above, is exposed to light under a transparent original or master, an image is obtained which, upon development with dilute alkalies, acids or organic solvents, produces a printing plate. The remaining hydrophobic light-decomposition products are receptive to greasy ink, and positive printing plates are obtained from negative originals. Because good water conductivity of the printing plate at the non-imaged areas is important, it is necessary to treat the printing surface of the printing plate, which has been developed with dilute alkalies or with solvents, to treatment with a dilute acid.

It has been found, in accordance with the present invention, that light-sensitive reproduction material useful for the production of printing plates, shows particular advantages when the light-sensitive layer contains, in addition to an iminoquinone-(1,4)-diazide of the above formula, a polyacrylic or polymethacrylic acid, or one or more copolymers obtained by the polymerization of acrylic acid with methacrylic acid, or one or both of them with functional derivatives of these acids; acrylic acid nitrile or acrylic acid amide are examples of such functional acrylic acid derivatives. The polyacrylic acid, or polymethacrylic acid, or copolymer of one or both acids, which is present as a constituent of the light-sensitive layer, renders the surface of the layer support hydrophilic. Thus, after development, i.e. after removing the non-imaged parts of the layer, it is unnecessary to treat the layer support or base material with dilute acid for the purpose of improving the water conductivity thereof. Further, in the production of printing plates from the light-sensitive material prepared in accordance with this invention, the developing operation is greatly simplified, since water is used as the developer. The use of water as a developer is greately to be preferred over an acid, for example, and thereby the development of the light-exposed layer is greatly facilitated.

The presence of polyacrylic acid, polymethacrylic acid, or the copolymers of one or both acids, in the light-sensitive layers, results in the additional advantage that the diazonium salts of the iminoquinone-(1,4)-diazides, may be employed with the same facility as the diazides themselves. The diazonium salts are obtained as intermediate products in the production of iminoquinone-diazides, for example the diazonium chlorides obtained from the aryl-sulfonated p-phenylene-diamines, and can be present as the light-sensitive component of the layers produced according to the present invention.

The light-sensitive material according to the invention is produced as follows: The iminoquinone-(1,4)-diazides and the polyacrylic acid, or polymethacrylic acid, or copolymers thereof, are dissolved in suitable organic solvents, preferably those having a boiling point in the range of about 80 to 150° C. The relative quantities in which the components may be present in the solution, may vary within wide limits, but solutions are preferred, however, in which the quantity of the light-sensitive component is not greater than twice the quantity of the colloidal component. Such homogeneous light-sensitive solutions are applied in a conventional manner onto the surface of a base material, for example, by whirling, spraying or brushing, and the layer is then dried. After drying the coated base material in a conventional manner, the light-sensitive material thereby obtained is exposed under a transparent original or master, and developed, using a water developer, i.e. the plate may be subjected to a short treatment with tap water. After linking the plate with greasy ink, it may be used as a printing plate. As base materials, metals such as aluminum and zinc, and paper, are suitable.

It may be advantageous in some cases to use mixtures of iminoquinone-(1,4)-diazides and diazonium salts thereof, in the light-sensitive layers produced according to the invention, particularly in those cases where the individual diazo compounds are inclined to crystallize on the surface of the base material.

Certain of the light-sensitive compounds present in the light-sensitive layers, produced according to the present invention, are described in the literature, but those which are not so described may be produced by analogy to the process used in the preparation of the known compounds.

Following is a list of structural formulae of various iminoquinone-(1,4)-diazides or diazonium salts of such diazides, which are suitable for use in the invention:

Formula 1

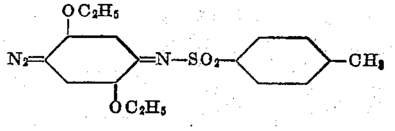

Formula 2

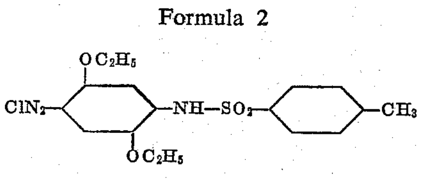

Formula 3

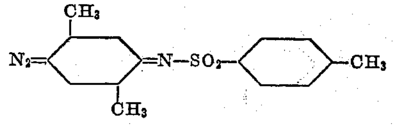

Formula 4

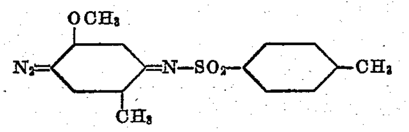

Formula 5

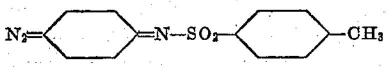

Formula 6

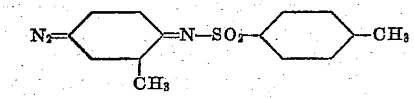

Formula 7

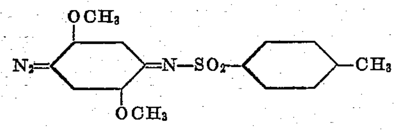

Formula 8

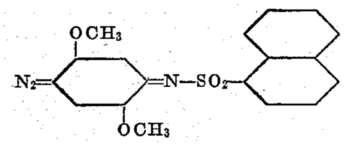

Formula 9

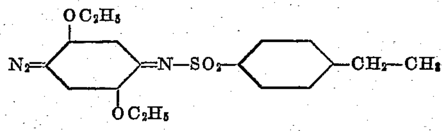

Formula 10

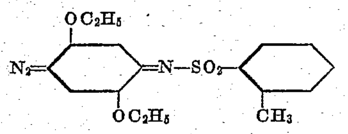

Formula 11

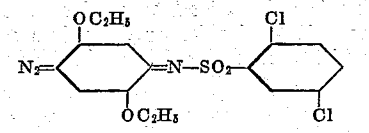

Formula 12

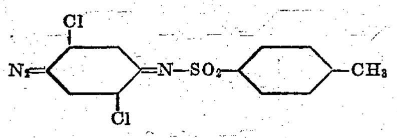

Formula 13

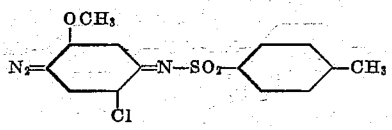

Formula 14

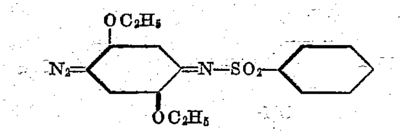

Formula 15

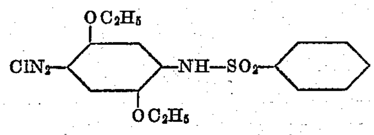

Formula 16

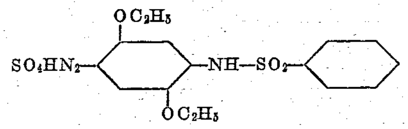

The compound corresponding to Formula 2 above, is obtained by diazotizing 4-amino-2,5-diethoxy-1-(4'-toluene-sulfonyl-amino)-benzene in dilute hydrochloric acid. The diazonium chloride melts at a temperature of 134° C. with decomposition.

The compounds corresponding to Formulae 4, 5, 9, 10, 11 and 12 are obtained in a manner analogous to that used in the preparation of the compound of Formula 1. These compounds have the following melting points:

Compound corresponding to Formula 4: 160° C., with decomposition
Compound corresponding to Formula 5: 170° C., with decomposition
Compound corresponding to Formula 9: 136° C., with decomposition
Compound corresponding to Formula 10: 133 to 135° C., with decomposition
Compound corresponding to Formula 11: 132° C., with decomposition
Compound corresponding to Formula 12: 165° C., with decomposition The compounds corresponding to Formulae 15 and 16 are obtained by diazotizing 4-amino-2,5-diethoxy-1-(benzene-sulfonyl-amino)-benzene in dilute hydrochloric acid (Formula 15), or in dilute sulfuric acid (Formula 16). The compound corresponding to Formula 15 melts at a temperature in the range of 105 to 107° C. with decomposition, and the compound corresponding to Formula 16 melts at a temperature in the range of 155 to 157° C. with decomposition.

The invention will be further illustrated by reference to the following specific examples:

*Example I*

0.5 part by weight of the iminoquinone-(1,4)-diazide corresponding to Formula 1 above, and 0.3 part by weight of polyacrylic acid of medium viscosity (intrinsic viscosity=0.5), (e..g. the polyacrylic acid K 155/2, sold by the German company Badische Anilin und Soda-Fabrik AG., Laudwigshafen (Rhine), where dissolved in 50 parts by volume of glycolmonomethyl-ether. A brushed aluminum foil was coated with this solution on one side thereof, by means of a plate-whirler, after which the foil was dried, first with hot air, and then, for complete removal of the solvent, drying was continued for a period of two minutes at a temperature of 100° C. The light-sensitive layer of the foil was then exposed to light for a period of about two minutes under a negative pattern or master, the light being an 18 amp. arc lamp, at a distance of 70 cm. The exposed layer, in which a faintly yellow-colored image became visible, was developed by washing with tap water, and without subjecting the developed foil to an acid after-treatment, it was immediately inked up with greasy ink, and could be used as a printing plate. A positive printing plate is obtained from a negative original.

*Example II*

A paper foil, such as that produced and sold by the S. D. Warren Company, Cumberland Mills, Maine, was coated with a 1% glycolmonomethylether solution of the diazo compound corresponding to Formula 2 above, and 0.6 percent by weight of polyacrylic acid of medium viscosity (intrinsic viscosity=0.5). The foil was further treated and exposed in accordance with the general procedure of Example I above, and then developed by means of a water spray, after which the image was inked with greasy ink. A positive printing plate was obtained from a negative pattern. The same good results can be obtained by using, instead of the compound corresponding to Formula 2 above, the diazo compounds corresponding to Formulae 15 and 16 above.

*Example III*

0.5 part by weight of the iminoquinone-(1,4)-diazide corresponding to Formula 3 above, and 0.25 part by weight of polyacrylic acid of medium viscosity (intrinsic viscosity=0.5) were dissolved in 50 parts by volume of glycolmonomethylether. A mechanically-roughened aluminum foil was coated with this solution and dried in a warm air current. After exposing the light-sensitive layer under a negative master, the layer was developed with tap water and, without an acid treatment, the positive image was inked with greasy ink and used as a printing plate. The same good results are obtained using the compounds corresponding to Formulae 4–9, instead of the compound corresponding to Formula 3. For the preparation of the coating solution, the compound corresponding to Formula 8 preferably is dissolved in dimethylformamide.

*Example IV*

A coating solution was produced by dissolving 0.5 part by weight of the iminoquinone-(1,4)-diazide corresponding to Formula 10, 0.25 part by weight of polymethacrylic acid (intrinsic viscosity=0.7) and 0.25 part by weight of polyacrylic acid of medium viscosity (intrinsic viscosity=0.5) in 200 parts by volume of glycolmonomethylether. An aluminum foil coated with this solution was then developed according to the procedure of Example I above.

*Example V*

A solution containing 0.25 part by weight of the iminoquinone-(1,4)-diazide corresponding to Formula 11 above, and 0.25 part by weight of polymethacrylic acid (intrinsic viscosity=0.7) in 100 parts by volume of glycolmonomethylether, was whirled onto the roughened side of a mechanically roughened aluminum foil. A printing plate was obtained from the sensitized foil by exposing the foil to light under a master and developing it with water in accordance with the procedure of Example I above.

*Example VI*

0.25 part by weight of the iminoquinone-(1,4)-diazide corresponding to Formula 12 above, 0.25 part by weight of the iminoquinone-(1,4)-diazide corresponding to Formula 13 above, and 0.3 part by weight of polyacrylic acid of medium viscosity (intrinsic viscosity=0.5) were dissolved in 100 parts by volume of a mixture of equal parts by weight of glycolmonomethyl-ether, and dimethylformamide. An anodically oxidized aluminum foil was then coated with this solution, after which the foil was exposed to light under a master and developed with water, in accordance with the procedure of Example I above. The developed foil could be used as a printing plate.

*Example VII*

A zinc base plate was treated with an aqueous solution containing 4 percent of acetic acid and 4 percent of potassium aluminum sulfate, for a period of five minutes. The thus pretreated base plate was then coated with a solution containing 0.3 part by weight of the iminoquinone(1,4)-diazide corresponding to Formula 14 above, and 0.1 part by weight of polyacrylic acid of medium viscosity (intrinsic viscosity=0.5) in 15 parts by volume of a mixture of glycolmonomethylether and dimethyl-formamide (2:1). After drying the layer with hot air, the layer was exposed to light under a negative pattern or master and was then developed with water. After development, the image was immediately inked with greasy ink and was ready for printing. A positive printing plate was obtained from the negative pattern.

*Example VIII*

0.5 part by weight of the iminoquinone-(1,4)-diazide corresponding to Formula 1 above, and 0.25 part by weight of a copolymer obtained by polymerizing equal parts by weight of acrylic acid and methacrylic acid were dissolved in 100 parts by volume of glycol-monomethylether. A brushed aluminum foil was then coated with this solution; after drying, the coated foil was exposed to light under a negative pattern or master, and developed by means of a water spray, the development being complete after about one minute. The positive image remaining on the foil was inked immediately with greasy ink. A positive printing plate was obtained from the negative pattern.

*Example IX*

A mechanically roughened aluminum foil was coated with a solution containing 0.5 part by weight of the iminoquinone-(1,4)-diazide corresponding to Formula 15 above, and 0.25 part by weight of a copolymer of acrylic acid and acrylic acid methyl-ester (2:1) in 100 parts by volume of glycolmonomethylether. The solution was then dried, and the resulting light-sensitive layer was exposed under a negative transparent pattern or master. In developing the image, the exposed side of the foil was subjected to a water spray for a period of about 30 seconds, after which the foil was inked up with greasy ink. A positive printing plate was obtained from the negative pattern.

*Example X*

A solution of 0.5 part by weight of the iminoquinone-(1,4)-diazide corresponding to Formula 10 above, and 9.25 part by weight of a copolymer of acrylic acid and acrylic acid amide (2:1) in 100 parts by volume of dimethyl-formamide, was coated onto a brushed aluminum foil. After drying the applied solution, the foil was exposed under a negative transparent original or master. The development of the exposed layer was effected by subjecting the imaged side of the foil to a water spray. After inking the developed foil with greasy ink, a positive image ready for printing was obtained.

In the accompanying claims, the term "a polyacrylic acid" includes polyacrylic acid, polymethacrylic acid and copolymers thereof as well as copolymers thereof with other functional derivatives of these acids.

It will be obvious to those skilled in the art that many modifications may be made within the scope of the present invention without departing from the spirit thereof, and the invention includes all such modifications.

What is claimed is:

1. A presensitized printing plate comprising a base material having a coating thereon comprising a resinous polyacrylic acid and a compound selected from the group consisting of an iminoquinone-diazide and diazonium salts thereof, the diazide having the formula

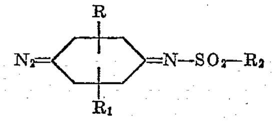

in which R and $R_1$ are selected from the group consisting of hydrogen, alkyl, alkoxy, and halide radicals, and $R_2$ is an aryl group.

2. A presensitized printing plate comprising a base material having a coating thereon comprising a resinous polyacrylic acid and a compound selected from the group consisting of an iminoquinone-diazide and diazonium salts thereof, the diazide having the formula

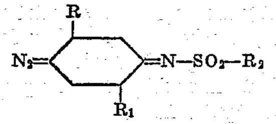

in which R and $R_1$ are alkoxy radicals and $R_2$ is an aryl group.

3. A presensitized printing plate comprising a base material having a coating thereon comprising a resinous polyacrylic acid and a compound selected from the group consisting of an iminoquinone-diazide and diazonium salts thereof, the diazide having the formula

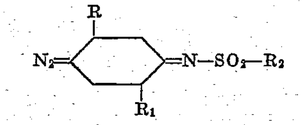

in which R and $R_1$ are alkyl radicals and $R_2$ is an aryl group.

4. A presensitized printing plate comprising a base material having a coating thereon comprising a resinous polyacrylic acid and a compound selected from the group consisting of an iminoquinone-diazide and diazonium salts thereof, the diazide having the formula

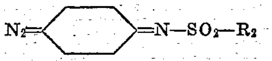

in which $R_2$ is an aryl group.

5. A presensitized printing plate comprising a base material having a coating thereon comprising a resinous polyacrylic acid and a compound selected from the group consisting of an iminoquinone-diazide and diazonium salts thereof, the diazide having the formula

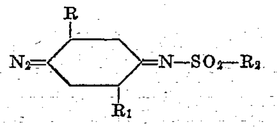

in which R and $R_1$ are alkoxy and $R_2$ is an aryl group.

6. A presensitized printing plate comprising a base material having a coating thereon comprising a resinous polyacrylic acid and a compound selected from the group consisting of an iminoquinone-diazide and diazonium salts thereof, the diazide having the formula

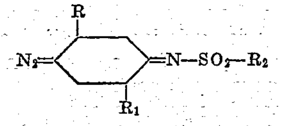

in which R and $R_1$ are halide radicals and $R_2$ is an aryl group.

7. A method of developing a printing plate which comprises exposing to light under a master a base material having a layer thereon comprising a resinous polyacrylic acid and a compound selected from the group consisting of an iminoquinone-diazide and diazonium salts thereof, the diazide having the formula

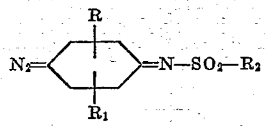

in which R and $R_1$ are selected from the group consisting of hydrogen, alkyl, alkoxy, and halide radicals, and $R_2$ is an aryl group, and treating the light-exposed layer with a developer.

8. A method according to claim 7 in which the developer is water.

9. A method of developing a printing plate which comprises exposing to light under a master a base material having a layer thereon comprising a resinous polyacrylic acid and a compound selected from the group consisting of an aminoquinone-diazide and diazonium salts thereof, the diazide having the formula

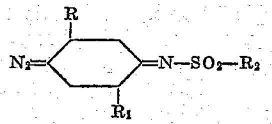

in which R and $R_1$ are alkoxy radicals and $R_2$ is an aryl group, and treating the light-exposed layer with a water developer.

10. A method of developing a printing plate which comprises exposing to light under a master a base material having a layer thereon comprising a resinous polyacrylic acid and a compound selected from the group consisting of an iminoquinone-diazide and diazonium salts thereof, the diazide having the formula

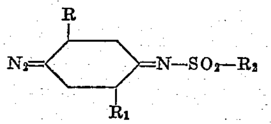

in which R and $R_1$ are alkyl radicals and $R_2$ is an aryl group, and treating the light-exposed layer with a water developer.

11. A method of developing a printing plate which comprises exposing to light under a master a base material having a layer thereon comprising a resinous polyacrylic acid and a compound selected from the group consisting of an iminoquinone-diazide and diazonium salts thereof, the diazide having the formula

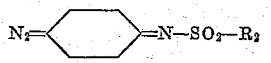

in which $R_2$ is an aryl group, and treating the light-exposed layer with a water developer.

12. A method of developing a printing plate which comprises exposing to light under a master a base material having a layer thereon comprising a resinous polyacrylic acid and a compound selected from the group consisting of an iminoquinone-diazide and diazonium salts thereof, the diazide having the formula

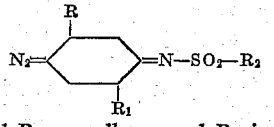

in which R and $R_1$ are alkoxy and $R_2$ is an aryl group, and treating the light-exposed layer with a water developer.

13. A method of developing a printing plate which comprises exposing to light under a master a base material having a layer thereon comprising a resinous polyacrylic acid and a compound selected from the group consisting of an iminoquinone-diazide and diazonium salts thereof, the diazide having the formula

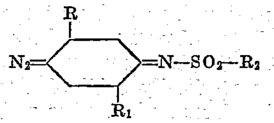

in which R and $R_1$ are halide radicals and $R_2$ is an aryl group, and treating the light-exposed layer with a water developer.

14. A presensitized printing plate comprising a base material having a resinous coating thereon comprising a polyacrylic acid and a compound selected from the group consisting of an iminoquinone-diazide and diazonium salts thereof, the diazide having the formula

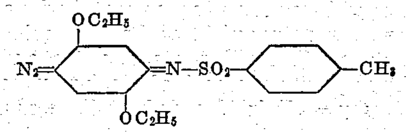

15. A presensitized printing plate comprising a base material having a coating thereon comprising a resinous polyacrylic acid and a compound selected from the group consisting of an iminoquinone-diazide and diazonium salts thereof, the diazonium chloride having the formula

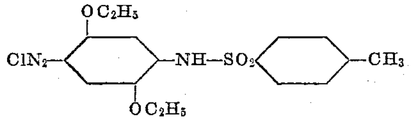

16. A presensitized printing plate comprising a base material having a coating thereon comprising a resinous polyacrylic acid and a compound selected from the group consisting of an iminoquinone-diazide and diazonium salts thereof, the diazide having the formula

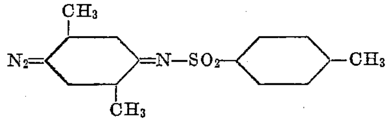

17. A presensitized printing plate comprising a base material having a coating thereon comprising a resinous polyacrylic acid and a compound selected from the group consisting of an iminoquinone-diazide and diazonium salts thereof, the diazide having the formula

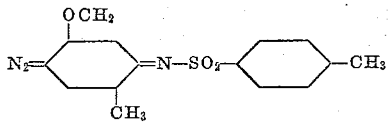

18. A presensitized printing plate comprising a base material having a resinous coating thereon comprising a polyacrylic acid and a compound selected from the group consisting of an iminoquinone-diazide and diazonium salts thereof, the diazide having the formula

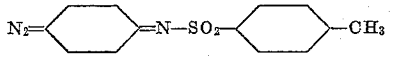

19. A presensitized printing plate comprising a base material having a resinous coating thereon comprising a polyacrylic acid and a compound selected from the group consisting of an iminoquinone-diazide and diazonium salts thereof, the diazide having the formula

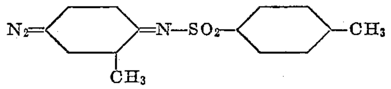

20. A presensitized printing plate comprising a base material having a resinous coating thereon comprising a polyacrylic acid and a compound selected from the group consisting of an iminoquinone-diazide and diazonium salts thereof, the diazide having the formula

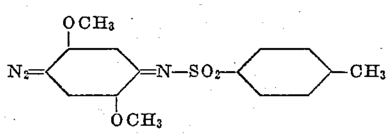

21. A presensitized printing plate comprising a base material having a resinous coating thereon comprising a polyacrylic acid and a compound selected from the group consisting of an iminoquinone-diazide and diazonium salts thereof, the diazide having the formula

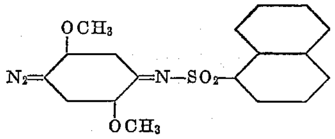

22. A presensitized printing plate comprising a base material having a resinous coating thereon comprising a polyacrylic acid and a compound selected from the group consisting of an iminoquinone-diazide and diazonium salts thereof, the diazide having the formula

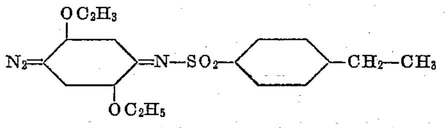

23. A presensitized printing plate comprising a base material having a resinous coating thereon comprising a polyacrylic acid and a compound selected from the group consisting of an iminoquinone-diazide and diazonium salts thereof, the diazide having the formula

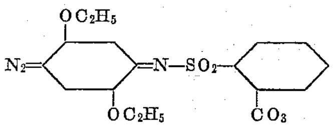

24. A presensitized printing plate comprising a base material having a resinous coating thereon comprising a polyacrylic acid and a compound selected from the group consisting of an iminoquinone-diazide and diazonium salts thereof, the diazide having the formula

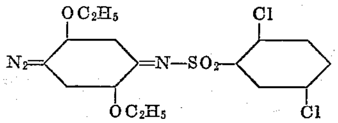

25. A presensitized printing plate comprising a base material having a resinous coating thereon comprising a polyacrylic acid and a compound selected from the group consisting of an iminoquinone-diazide and diazonium salts thereof, the diazide having the formula

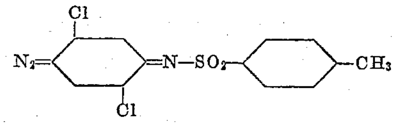

26. A presensitized printing plate comprising a base material having a resinous coating thereon comprising a polyacrylic acid and a compound selected from the group consisting of an iminoquinone-diazide and diazonium salts thereof, the diazide having the formula

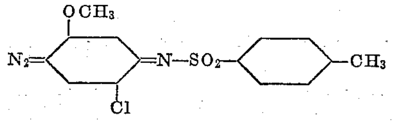

27. A presensitized printing plate comprising a base material having a coating thereon comprising a resinous polyacrylic acid and a compound selected from the group consisting of an iminoquinone-diazide and diazonium salts thereof, the diazide having the formula

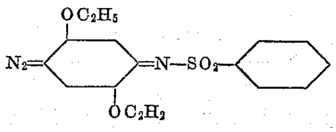

28. A presensitized printing plate comprising a base material having a coating thereon comprising a resinous polyacrylic acid and a compound selected from the group consisting of an iminoquinone-diazide and diazonium salts thereof, the diazonium chloride having the formula

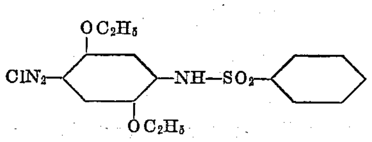

29. A presensitized printing plate comprising a base material having a coating thereon comprising a resinous polyacrylic acid and a compound selected from the group consisting of an iminoquinone-diazide and diazonium salts thereof, the diazonium sulfate having the formula

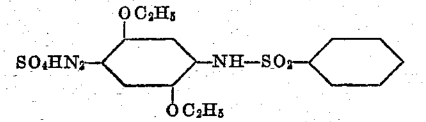

30. A method of developing a printing plate which comprises exposing to light under a master a base material having a layer thereon comprising a resinous polyacrylic acid and a compound selected from the group consisting of an iminoquinone-diazide and diazonium salts thereof, the diazide having the formula

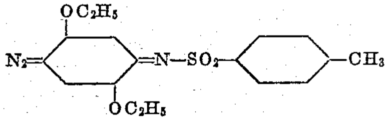

and treating the light-exposed layer with a water developer.

31. A method of developing a printing plate which comprises exposing to light under a master a base material having a layer thereon comprising a resinous polyacrylic acid and a compound selected from the group consisting of an iminoquinone-diazide and diazonium salts thereof, the diazonium chloride having the formula

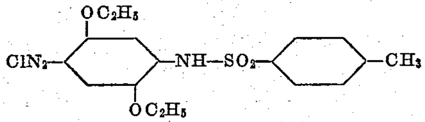

and treating the light-exposed layer with a water developer.

32. A method of developing a printing plate which comprises exposing to light under a master a base material having a layer thereon comprising a resinous polyacrylic acid and a compound selected from the group consisting of an iminoquinone-diazide and diazonium salts thereof, the diazide having the formula

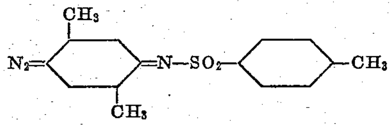

and treating the light-exposed layer with a water developer.

33. A method of developing a printing plate which comprises exposing to light under a master a base material having a layer thereon comprising a resinous polyacrylic acid and a compound selected from the group consisting of an iminoquinone-diazide and diazonium salts thereof, the diazide having the formula

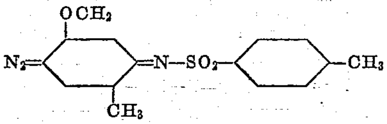

and treating the light-exposed layer with a water developer.

34. A method of developing a printing plate which comprises exposing to light under a master a base material having a layer thereon comprising a resinous polyacrylic acid and a compound selected from the group consisting of an iminoquinone-diazide and diazonium salts thereof, the diazide having the formula

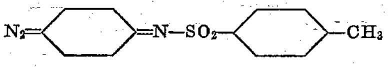

and treating the light-exposed layer with a water developer.

35. A method of developing a printing plate which comprises exposing to light under a master a base material having a layer thereon comprising a resinous polyacrylic acid and a compound selected from the group consisting of an iminoquinone-diazide and diazonium salts thereof, the diazide having the formula

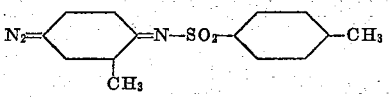

and treating the light-exposed layer with a water developer.

36. A method of developing a printing plate which comprises exposing to light under a master a base material having a layer thereon comprising a resinous polyacrylic acid and a compound selected from the group consisting of an iminoquinone-diazide and diazonium salts thereof, the diazide having the formula

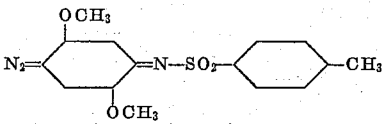

and treating the light-exposed layer with a water developer.

37. A method of developing a printing plate which comprises exposing to light under a master a base material having a layer thereon comprising a resinous polyacrylic acid and a compound selected from the group consisting of an iminoquinone-diazide and diazonium salts thereof, the diazide having the formula

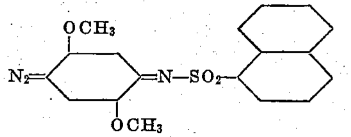

and treating the light-exposed layer with a water developer.

38. A method of developing a printing plate which comprises exposing to light under a master a base material having a layer thereon comprising a resinous polyacrylic acid and a compound selected from the group consisting of an iminoquinone-diazide and diazonium salts thereof, the diazide having the formula

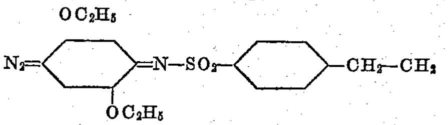

and treating the light-exposed layer with a water developer.

39. A method of developing a printing plate which comprises exposing to light under a master a base material having a layer thereon comprising a resinous polyacrylic acid and a compound selected from the group consisting of an iminoquinone-diazide and diazonium salts thereof, the diazide having the formula

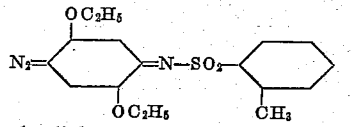

and treating the light-exposed layer with a water developer.

40. A method of developing a printing plate which comprises exposing to light under a master a base material having a layer thereon comprising a resinous polyacrylic acid and a compound selected from the group consisting of an iminoquinone-diazide and diazonium salts thereof, the diazide having the formula

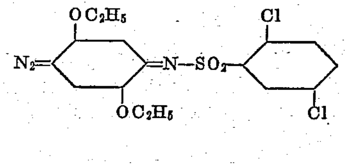

and treating the light-exposed layer with a water developer.

41. A method of developing a printing plate which comprises exposing to light under a master a base material having a layer thereon comprising a resinous polyacrylic acid and a compound selected from the group consisting of an iminoquinone-diazide and diazonium salts thereof, the diazide having the formula

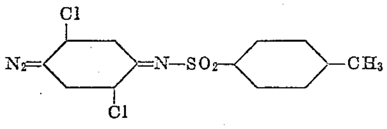

and treating the light-exposed layer with a water developer.

42. A method of developing a printing plate which comprises exposing to light under a master a base material having a layer thereon comprising a resinous polyacrylic acid and a compound selected from the group consisting of an iminoquinone-diazide and diazonium salts thereof, the diazide having the formula

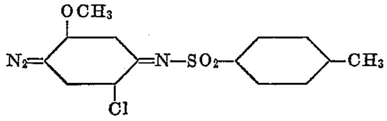

and treating the light-exposed layer with a water developer.

43. A method of developing a printing plate which comprises exposing to light under a master a base material having a layer thereon comprising a resinous polyacrylic acid and a compound selected from the group consisting of an iminoquinone-diazide and diazonium salts thereof, the diazide having the formula

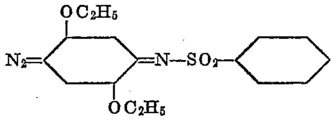

and treating the light-exposed layer with a water developer.

44. A method of developing a printing plate which comprises exposing to light under a master a base material having a layer thereon comprising a resinous polyacrylic acid and a compound selected from the group consisting of an iminoquinone-diazide and diazonium salts thereof, the diazonium chloride having the formula

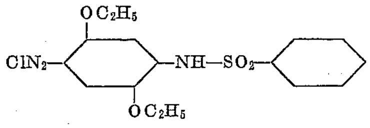

and treating the light-exposed layer with a water developer.

45. A method of developing a printing plate which comprises exposing to light under a master a base material having a layer thereon comprising a resinous polyacrylic acid and a compound selected from the group consisting of an iminoquinone diazide and diazonium salts thereof, the diazonium sulfate having the formula

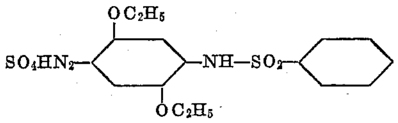

and treating the light-exposed layer with a water developer.

References Cited in the file of this patent

UNITED STATES PATENTS

| | | |
|---|---|---|
| 1,981,102 | Hagedorn et al. | Nov. 20, 1934 |
| 2,687,958 | Neugebauer | Aug. 31, 1954 |
| 2,759,817 | Schmidt et al. | Aug. 21, 1956 |

FOREIGN PATENTS

| | | |
|---|---|---|
| 838,699 | Germany | May 12, 1952 |